United States Patent
Gutsche et al.

(10) Patent No.: US 6,774,005 B2
(45) Date of Patent: Aug. 10, 2004

(54) METHOD FOR FABRICATING A METAL CARBIDE LAYER AND METHOD FOR FABRICATING A TRENCH CAPACITOR CONTAINING A METAL CARBIDE

(75) Inventors: Martin Gutsche, Dorfen (DE); Peter Moll, Dresden (DE); Bernhard Sell, Dresden (DE); Annette Sänger, Dresden (DE); Harald Seidl, Feldkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/206,303

(22) Filed: Jul. 26, 2002

(65) Prior Publication Data
US 2003/0022457 A1 Jan. 30, 2003

(30) Foreign Application Priority Data
Jul. 26, 2001 (DE) .......................................... 101 36 400

(51) Int. Cl.$^7$ .......................................... H01L 21/8242
(52) U.S. Cl. ...................... 438/387; 438/244; 438/660; 438/702; 438/703; 438/795
(58) Field of Search ................................ 438/244, 387, 438/660, 700, 702, 703, 795, FOR 220, FOR 430

(56) References Cited

U.S. PATENT DOCUMENTS

| | | | | |
|---|---|---|---|---|
| 5,432,806 A | * | 7/1995 | Snitzer ........................... 372/6 |
| 5,561,082 A | * | 10/1996 | Matsuo et al. ............... 438/396 |
| 5,907,188 A | * | 5/1999 | Nakajima et al. ........... 257/751 |
| 6,107,136 A | * | 8/2000 | Melnick et al. ............. 438/253 |
| 6,133,150 A | * | 10/2000 | Nakajima et al. ........... 438/694 |
| 6,184,550 B1 | * | 2/2001 | Van Buskirk et al. ...... 257/306 |
| 6,274,008 B1 | * | 8/2001 | Gopalraja et al. ..... 204/192.17 |
| 6,333,255 B1 | * | 12/2001 | Sekiguchi .................... 438/622 |
| 6,440,878 B1 | * | 8/2002 | Yang et al. ................. 438/783 |
| 6,445,070 B1 | * | 9/2002 | Wang et al. ................ 257/751 |
| 2002/0142539 A1 | * | 10/2002 | Tu et al. ..................... 438/239 |

* cited by examiner

Primary Examiner—George Fourson
Assistant Examiner—Joanne Adelle Garcia
(74) Attorney, Agent, or Firm—Laurence A. Greenberg; Werner H. Stemer; Ralph E. Locher

(57) ABSTRACT

At least a partial layer of an upper capacitor electrode is formed by metal carbide, preferably by a transition metal carbide. In one embodiment, the metal carbide layer is formed by depositing an alternating sequence of metal-containing layers and carbon-containing layers on top of one another and then subjecting them to a heat treatment, in such a manner that they mix with one another. The patterning of the layer sequence can be carried out before the carbide formation step.

12 Claims, 7 Drawing Sheets

US 6,774,005 B2

METHOD FOR FABRICATING A METAL CARBIDE LAYER AND METHOD FOR FABRICATING A TRENCH CAPACITOR CONTAINING A METAL CARBIDE

BACKGROUND OF THE INVENTION

Field of the Invention

The present invention relates to a method for fabricating a metal carbide layer and a method for fabricating a trench capacitor for use in a semiconductor memory cell.

In dynamic random access memory cell configurations, it is virtually exclusively that single-transistor memory cells are used. A single-transistor memory cell contains a read transistor and a storage capacitor. The information is stored in the storage capacitor in the form of an electric charge that represents a logic 0 or a logic 1. Actuating the read transistor via a word line allows the information to be read via a bit line. The storage capacitor must have a minimum capacitance for reliably storing the charge and, at the same time, to make it possible to differentiate the information item that has been read. The lower limit for the capacitance of the storage capacitor is currently considered to be 25 fF.

Since the storage density increases from memory generation to memory generation, the surface area required by the single-transistor memory cell must be reduced from generation to generation. At the same time, the minimum capacitance of the storage capacitor has to be retained.

Up to the 1 Mbit generation, both the read transistor and the storage capacitor were produced as planar components. Beyond the 4 Mbit memory generation, the area taken up by the memory cell was reduced further by using a three-dimensional configuration of the read transistor and storage capacitor. One possibility is for the capacitor to be produced in a trench (see the reference by K. Yamada et al., Proc. Intern. Electronic Devices and Materials IEDM 85, pp. 702 ff.). In this case, a diffusion region which adjoins the wall of the trench and a doped polysilicon filling disposed in the trench act as electrodes for the storage capacitor. Therefore, the electrodes of the storage capacitor are disposed along the surface of the trench. In this way, the effective surface area of the storage capacitor, on which the capacitance is dependent, is increased with respect to the space taken up by the storage capacitor on the surface of the substrate, which corresponds to the cross section of the trench. Although there are limits on the extent to which the depth of the trench can be increased, for technological reasons, the packing density can be further increased by reducing the cross section of the trench.

However, one difficulty of the decreasing trench cross section is the increasing electrical resistance of the trench filling and the associated increase in the read-out time of the DRAM memory cell. Therefore, to ensure a high read-out speed as the trench cross section is further reduced in size, it is necessary to select materials with a lower resistivity for the electrodes of the trench capacitor. In current trench capacitors, the trench filling consists of doped polycrystalline silicon, so that as miniaturization continues a high series resistance of the trench filling results.

There have already been various proposals for depositing a metal or a layer sequence which contains a metal-containing layer onto the storage dielectric in the trench. A general problem in this context is the high aspect ratio of the capacitor trench into which a layer sequence has to be deposited if possible in such a manner that it forms a good and permanent mechanical and electrical contact with the storage dielectric below it and that no voids are formed within the capacitor electrode. A further problem is that many metals do not have a particularly high ability to withstand heat.

Published, European Patent Application EP 0 981 158 A2 describes the fabrication of a DRAM memory cell which has a trench capacitor and a select transistor which is connected thereto via a buried strap. The trench capacitor has a lower capacitor electrode, which adjoins a wall of the trench, a capacitor dielectric and an upper capacitor electrode. The trench capacitor is fabricated by forming the upper capacitor electrode in the lower trench region, then depositing an insulating collar in the upper trench region, and then completing the upper capacitor electrode. With regard to the trench filling which forms the upper capacitor electrode, it is specifically stated that this filling may be formed by a metal both in the lower region of the trench and in the upper region of the insulating collar. In any event, however, the trench filling in the region of the insulating collar is formed in one step and therefore from the same material as the buried strap. Therefore, if a metal is formed into the insulating collar, the buried strap also has to be formed from metal. However, in this context it is possible that the select transistor may be adversely affected by the contact that is made with a highly conductive material at the drain region. Moreover, no details are given as to the nature of the metal that is to be used.

U.S. Pat. No. 5,905,279 discloses a memory cell having a storage capacitor disposed in a trench and a select transistor. The storage capacitor has a lower capacitor electrode, which adjoins a wall of the trench, a capacitor dielectric and an upper capacitor electrode. The upper capacitor electrode contains a layer stack formed of polysilicon, a metal-containing, electrically conductive layer, in particular made from WSi, TiSi, W, Ti or TiN, and polysilicon. The trench capacitor is fabricated by first forming the upper capacitor electrode in the lower trench region. Then, an insulating collar is deposited in the upper trench region, and next the upper capacitor electrode is completed. Alternatively, the method is carried out on a silicon-on-insulator (SOI) substrate which does not have an insulating collar, in which case the upper capacitor electrode, which contains a lower polysilicon layer and a tungsten silicide filling, is fabricated in a single-step deposition method, in which the individual layers are deposited entirely in the trench. Although the metals described in this document, such as tungsten, titanium or silicides thereof, are highly temperature stable, the reduction in the series resistance of the upper capacitor electrode which can be achieved in theory with this method is still unsatisfactory.

International Patent Disclosure WO 01/29280 discloses a method for depositing thin layers of metal carbide by an alternating deposition of a transition metal layer and a carbon layer with layer thicknesses at the atomic level (atomic layer deposition (ALD)) on a substrate. Rearrangement processes on the heated substrate result in the formation of a metal carbide layer in situ.

U.S. Pat. No. 5,680,292 likewise describes, inter alia, a method for forming tungsten or molybdenum carbide layers. First, a corresponding metal oxide layer is deposited, and then the layer is subjected to a carbon treatment at elevated temperature in an oxygen-reducing environment.

SUMMARY OF THE INVENTION

It is accordingly an object of the invention to provide a method for fabricating a metal carbide layer and a method for fabricating a trench capacitor containing a metal carbide which overcomes the above-mentioned disadvantages of the prior art methods of this general type, which makes it possible to form the trench capacitor with a reduced series resistance and a high thermal stability. A second object of the present invention is to provide a method for fabricating a metal carbide layer that is able to simplify the shaping or patterning of the metal carbide layer.

With the foregoing and other objects in view there is provided, in accordance with the invention, a method for fabricating a trench capacitor for use in a semiconductor memory cell. The method includes the steps of providing a substrate, forming a trench in the substrate, forming a lower capacitor electrode adjoining a wall of the trench in a lower trench region, and providing a storage dielectric. In the trench, the storage dielectric adjoins the lower capacitor electrode. An upper capacitor electrode is provided and is formed as a trench filling and adjoins the storage dielectric. The upper capacitor electrode is at least partly formed by metal carbide.

A first aspect of the present invention is based on the idea of fabricating the trench filling, which forms the upper capacitor electrode, of the trench capacitor at least in part from metal carbide.

In particular, the carbides of the transition metals from subgroups IV, V and VI of the periodic system, i.e. in particular the metals Mo, W, Ta, Ti, Zr, Hf, V, Nb, have a number of advantages which make them suitable for the upper capacitor electrode of the trench capacitor of a semiconductor memory cell. In addition to their mechanical hardness and chemical stability, they are also distinguished by a high thermal stability (melting point>2500° C.) and high electrical conductivity (resistivity<70 $\mu\Omega$·cm). Particularly the latter two properties are generally of considerable interest for use as electrode materials in semiconductor fabrication technology.

The trench filling may be formed completely or only partially by the metal carbide. Therefore, before and/or after the formation of the metal carbide section of the trench filling, it is additionally possible to deposit other conductive materials, such as polycrystalline silicon or other metal-containing materials, in the trench.

The metal carbide can be deposited directly in the trench by a chemical vapor deposition (CVD) process, for example, in the case of tungsten carbide, by using a $WF_6/C_3H_8/H_2$ mixture (in a ratio of 1:15:16) at a temperature of 1170 K in the CVD reactor. However, patterning of the electrodes causes problems in the fabrication of electrodes from homogeneous metal carbide material. The chemical stability of the substances results in that a high proportion of the dry etching processes which may be considered results from the physical component. However, as a result, the etching rate of the carbide layers is of the same order of magnitude as the etching rate of the mask used for the etching. Furthermore, there may be high levels of redeposition on the mask, the substrate or on the installation itself.

Therefore, a second aspect of the present invention relates in general terms to a method for fabricating a metal carbide layer, in which, in a first method step of the fabrication, an alternating sequence of at least one metal-containing layer and at least one carbon-containing layer is deposited on a substrate and, in a subsequent, second method step, a heat treatment step is carried out in such a manner that the layer sequence is intimately mixed and converted into a substantially homogeneous metal carbide layer. The substrate may in this case be the dielectric of a capacitor, for example of a trench capacitor.

The deposition of the metal-containing and carbon-containing layers may be carried out by conventional chemical vapor deposition (CVD) processes. The method according to the invention relates in particular to the situation in which the metal-containing and carbon-containing layers are each formed from an elemental metal, such as tungsten (W), and from carbon (C) respectively. The layers of the alternating sequence are deposed until the trench is filled.

The method in accordance with the second aspect allows relatively simple patterning of the metal carbide layer as a result of the patterning being carried out by etching or the like before the metal carbide layer is formed, i.e. before the heat treatment step. This therefore makes it possible to use etching methods by which the metal-containing layer and the carbon-containing layer can be etched individually. Since the layers are generally easier to etch than the completed metal carbide layer, in practice the method is easier to carry out.

It is merely necessary to ensure that the etching rates of the metal-containing layer and of the carbon-containing layer should be substantially identical. In particular, the ratio of the etching rates of the metal-containing layer to the carbon-containing layer should lie in the range between 0.7 and 1.3. Examples of suitable etching media are $NF_3$ or $SF_6$ or mixtures thereof.

The heat treatment step may be carried out in a non-oxidizing protective gas atmosphere, with argon or mixtures of argon and hydrogen being particularly suitable protective gases. It is particularly advantageous if a hydrocarbon, in particular a simple hydrocarbon, such as for example propane, is added to the protective gas in order to prevent carbon from diffusing out of the layers, forming volatile hydrocarbons in the $H_2$ atmosphere. A hydrocarbon level of 1% is sufficient for this purpose.

The heat treatment is preferably carried out at temperatures in a range between 600° and 1200° C. In rapid thermal process (RTP) installations, the treatment times are between 30 and 120 seconds, and in conventional furnace processes the treatment times are between 15 minutes and 2 hours.

Furthermore, it is possible that a metal carbide layer is to be formed with a desired stoichiometric ratio between the metal and the carbon, for example in the form of WC, $W_2C$, $W_3C$ or $WC_{1-x}$. In this case, the metal-containing layers and the carbon-containing layers are deposited in a thickness or quantitative ratio with respect to one another which is such that, after the intimate mixing, the desired stoichiometric composition of the metal carbide layer which is to be formed results.

The method for fabricating a metal carbide layer in accordance with the second aspect represents a preferred embodiment for carrying out the method according to the invention for fabricating a trench capacitor, not least on account of the simplified patterning. This is because, in a method of this type, it is generally necessary to carry out at least one patterning or etching step, by which the trench filling of the upper capacitor electrode, after it has been deposited, is etched back again in part, i.e. to below the surface of the semiconductor substrate. In view of the high aspect ratios, in this context it is advantageous if the etching step does not encounter any major problems and can substantially be carried out in a conventional manner using a conventional etching medium.

In accordance with an added mode of the invention, there is the step of depositing a polycrystalline, doped silicon layer on the storage dielectric as part of the upper capacitor electrode.

Embodiments of the fabrication of a trench capacitor for a semiconductor memory cell are explained in more detail below. In the variants, in each case at least part of the upper capacitor electrode is formed by a metal carbide layer.

Other features which are considered as characteristic for the invention are set forth in the appended claims.

Although the invention is illustrated and described herein as embodied in a method for fabricating a metal carbide layer and a method for fabricating a trench capacitor containing a metal carbide, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
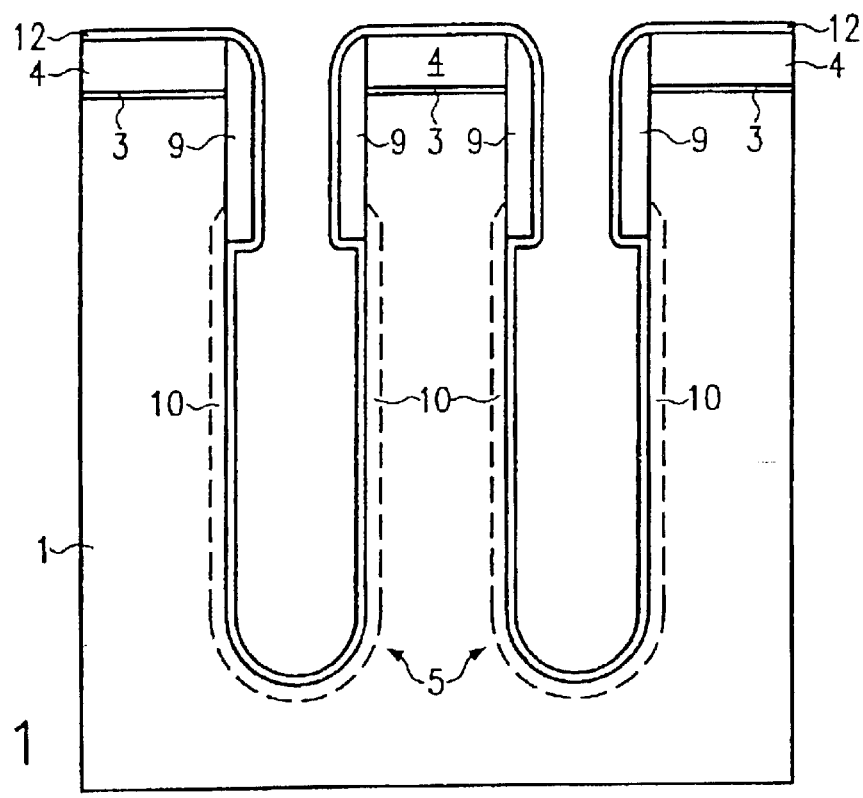
FIGS. 1–8 are diagrammatic, sectional views showing individual method steps involved in the fabrication of a trench capacitor, with an insulating collar being formed before deposition of a dielectric and the filling of a trench according to the invention.

Referring now to the figures of the drawing in detail and first, particularly, to FIGS. 1–8 thereof, there is shown a first embodiment using an inventive method for the fabrication of a trench capacitor.

In accordance with FIG. 1, a 5 nm thick $SiO_2$ layer 3 and a 200 nm thick $Si_3N_4$ layer 4 are applied to a main surface of a silicon substrate 1. Then, a non-illustrated 1000 nm thick BSG layer is applied as a hard mask material. Using the non-illustrated mask produced by photolithography, the BSG layer, the $Si_3N_4$ layer 4 and the $SiO_2$ layer 3 are patterned in a plasma etching process using $CF_4/CHF_3$, so that a hard mask is formed. After a removal of the mask produced by photolithography, trenches 5 are etched into the main surface in a further plasma etching process using $HBr/NF_3$ and the hard mask as an etching mask. Then, the BSG layer is removed by a wet etch using $H_2SO_4/HF$.

For example, the depth of the trenches 5 is 5 $\mu$m, their width is 100×250 nm and they are spaced apart from one another by 100 nm.

Then, in a manner that is known per se, an insulating collar 9 is formed in an upper section of the trench 5, as described, for example, in Published, Non-Prosecuted German Patent Application DE 199 44 012 A1 (see FIGS. 2B, 2C). The reason for this is as follows. In the region of the insulating collar 9, a parasitic transistor is formed between the electrically conductive trench filling which is yet to be produced and the substrate 1 and the doped regions formed in the substrate 1, the gate oxide of which transistor, without the presence of the insulating collar 9, would be formed by a dielectric 12 alone. The insulating collar 9 that forms the gate oxide layer is formed in a thickness that effectively disconnects the parasitic transistor.

Then, in a known way, a conductive region 10, that serves as a lower capacitor electrode, is formed by doping.

Alternatively, it is also possible for a conductive layer to be deposited in the trench 5. Then, the trench 5 is lined in a known way with a dielectric 12 (oxide or nitride layer or layer sequence thereof).

Figure 2:
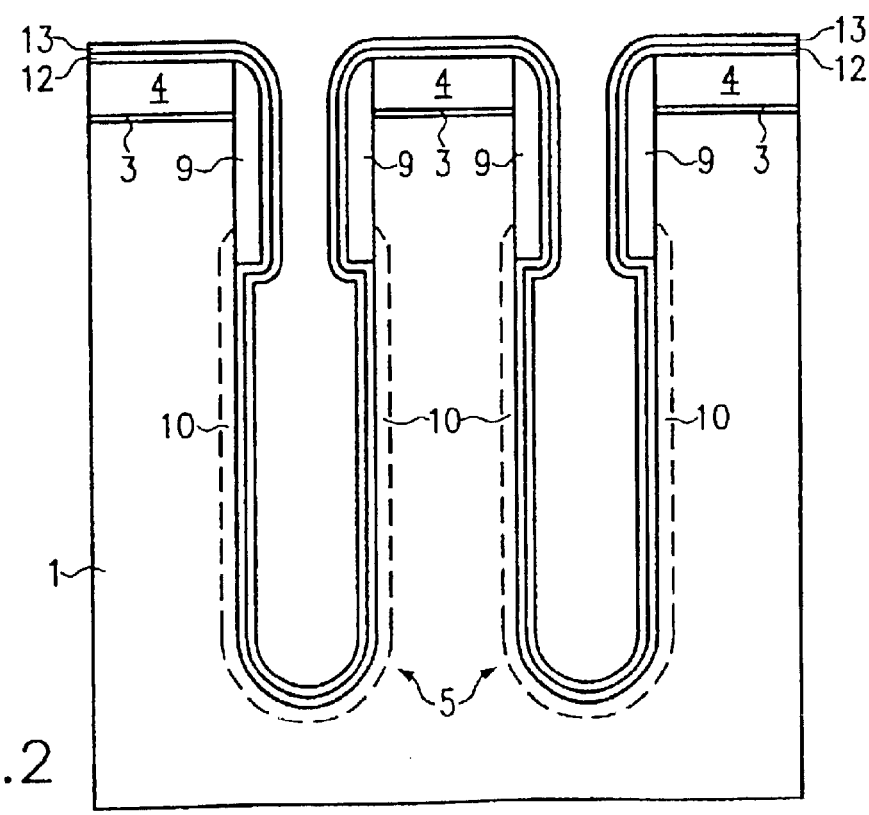

Next, as shown in FIG. 2, a chemical vapor deposition (CVD) process is used to deposit a first thin layer of metal 13, the thickness of which may be between 2 and 100 nm. In the present case, i.e. for a trench 5 having the dimensions described above, layer thicknesses of between 5 and 20 nm are particularly advantageous. If the metal that is to be deposited is tungsten (W), the deposition may take place, for example, in a single-wafer installation ("Centura", Applied Materials) at temperatures of between 400° C. and 500° C. and pressures between 20 and 60 torr. The tungsten is formed by reduction of $WF_6$ with $H_2$, with argon being used as carrier gas.

Figure 3:
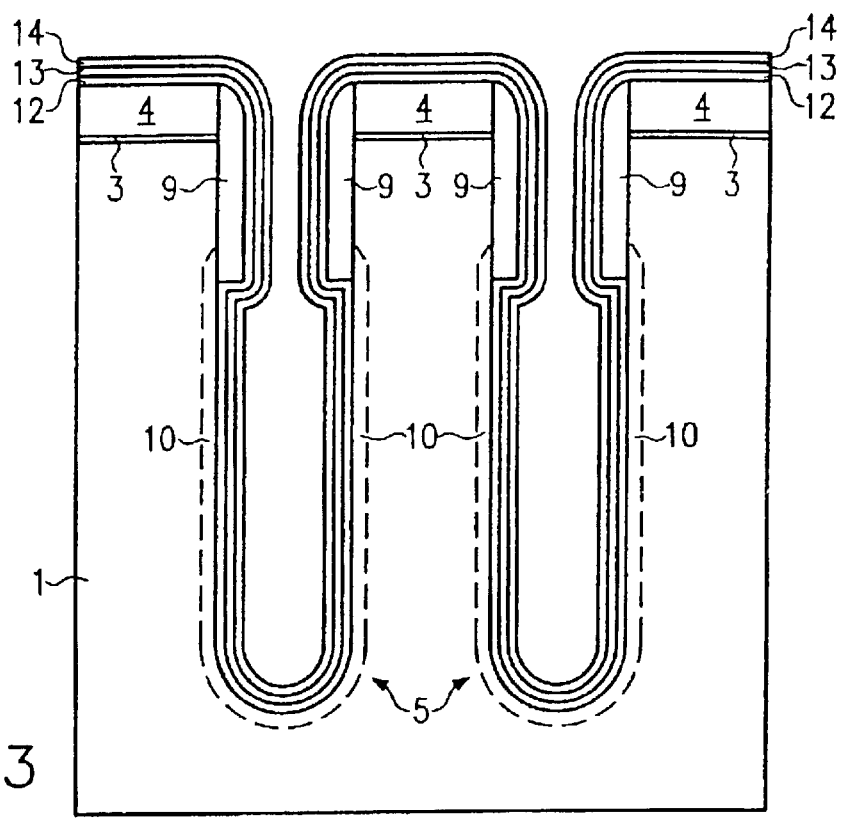

Then, as shown in FIG. 3, a first thin layer of carbon 14 is deposited on the metal layer 13 by a CVD process. In this case too, the thickness may be between 2 and 100 nm, with layer thicknesses of between 5 and 20 nm being preferred. The carbon layer 14 can be produced by plasma-enhanced CVD in corresponding CVD reactors, it being possible to use various hydrocarbons, such as methane, ethane, or propane, as precursors.

Figure 4:
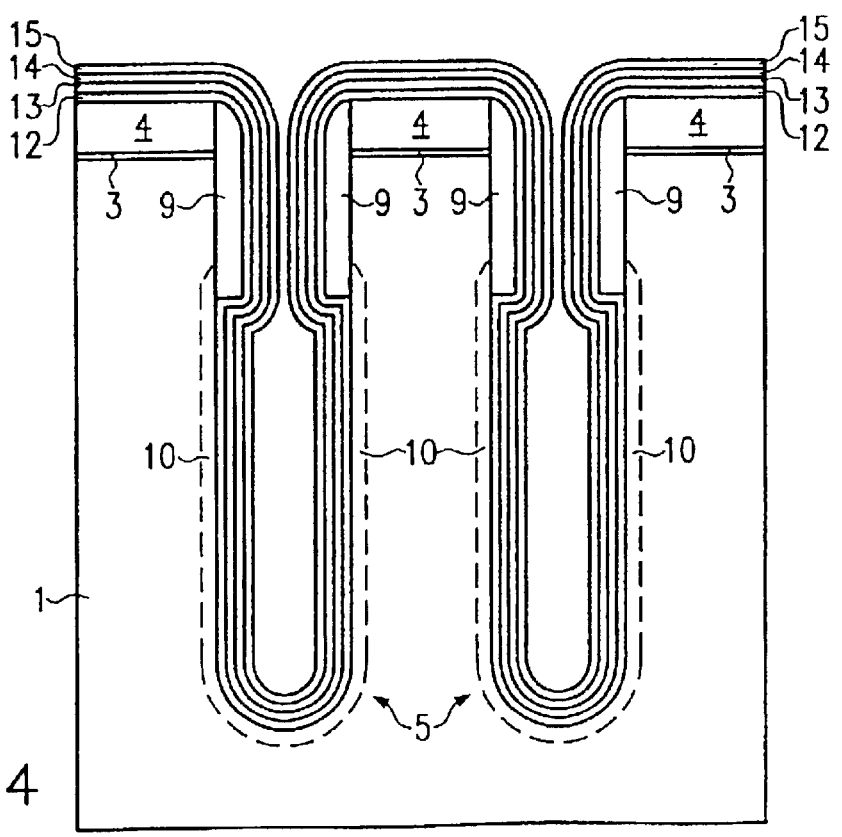
Figure 5:
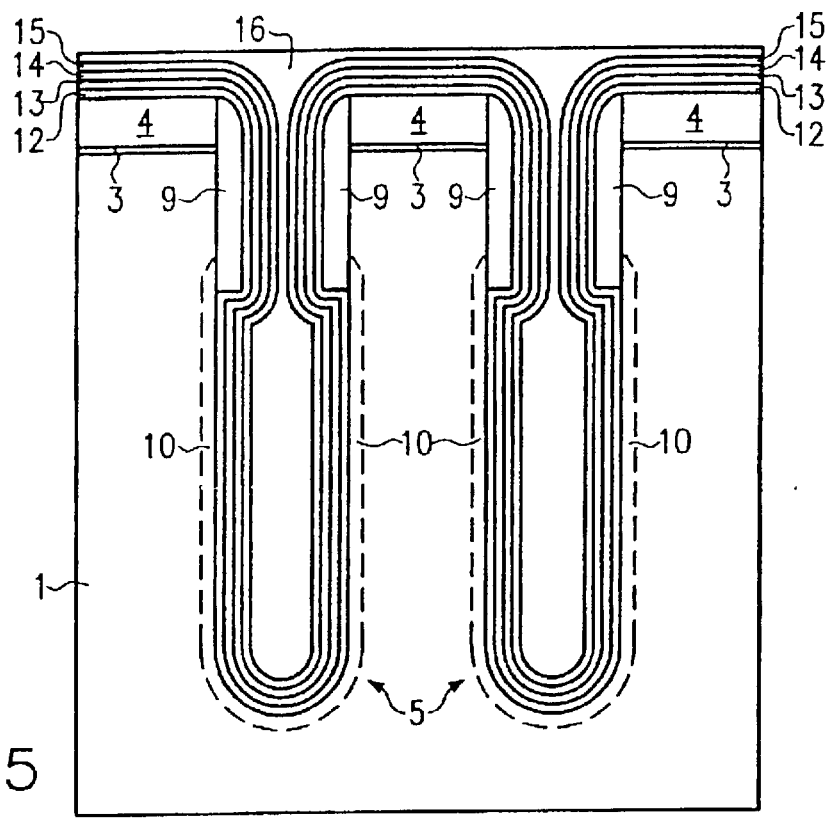

Then, as shown in FIGS. 4 and 5, a second metal layer 15 and then a second carbon layer 16 are deposited. During the deposition of the carbon layer 16, the trench 5 is filled; non-illustrated voids may be formed in the lower trench section below the collar region.

Figure 6:
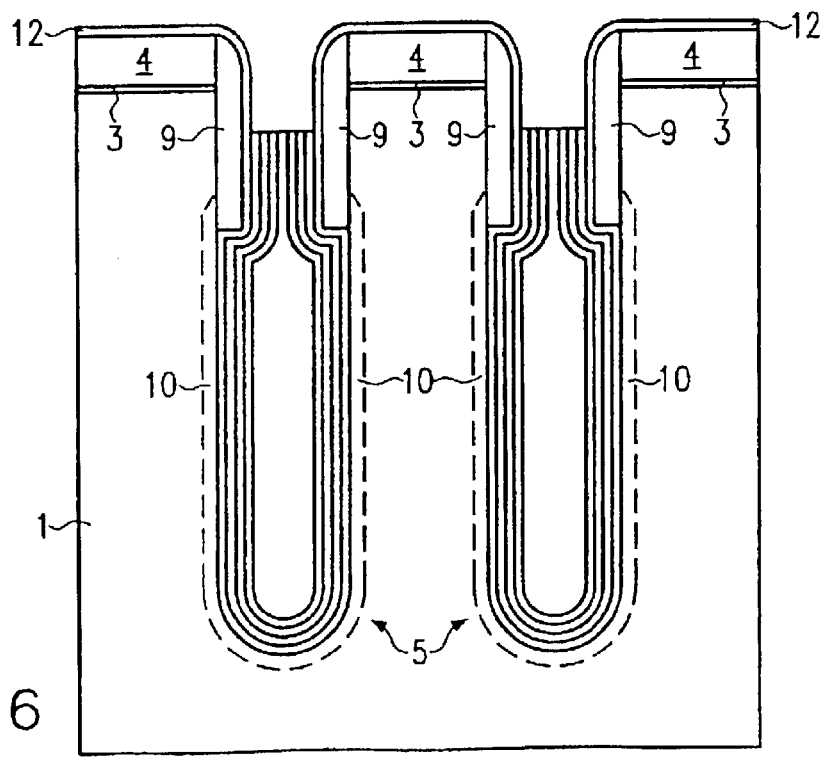

As shown in FIG. 6, the layer sequence containing the layers 13 to 16 is patterned by a dry etching step in such a manner that its surface is set back with respect to the main surface of the silicon substrate 1. The etching of the layer stack may be carried out using fluorine-containing and/or oxygen-containing but carbon-free gases. In the case of tungsten as the metal, examples of suitable etching media are $NF_3$ and/or $SF_6$, by which tungsten and carbon can be etched at substantially the same etching rate.

Figure 7:
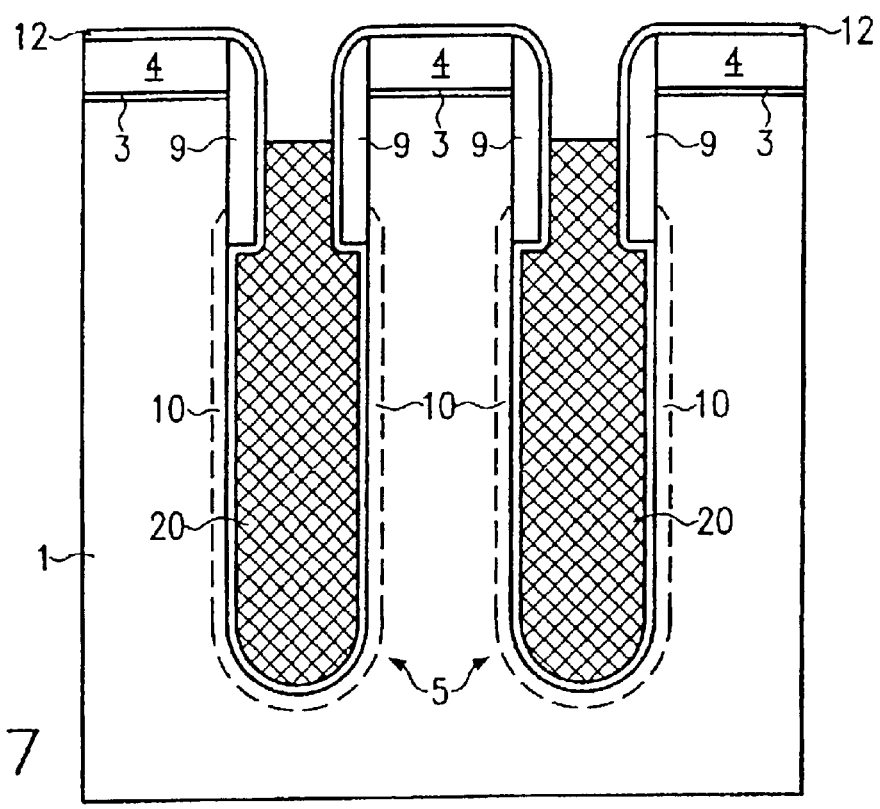

After the patterning of the trench filling has been carried out by a conventional etching method, the carbide formation may then take place, as shown in FIG. 7. To form the carbide, the wafer undergoes a heat treatment in a non-oxidizing atmosphere. The heat treatment takes place at temperatures between 600° C. and 1200° C., and the time of the treatment is between 30 and 120 seconds in the case of a rapid thermal process, or between 15 minutes and 2 hours in the case of a conventional furnace process. Argon or mixtures of argon and hydrogen are particularly suitable inert protective gases. In addition, a simple hydrocarbon, such as propane, may be added in an amount of 1% in order to prevent carbon depletion in the layers as a result of the formation of volatile hydrocarbons in the $H_2$ atmosphere. In this way, an upper capacitor electrode 20, which in the embodiment illustrated here consists entirely of metal carbide, is formed from the layer sequence.

Figure 8:
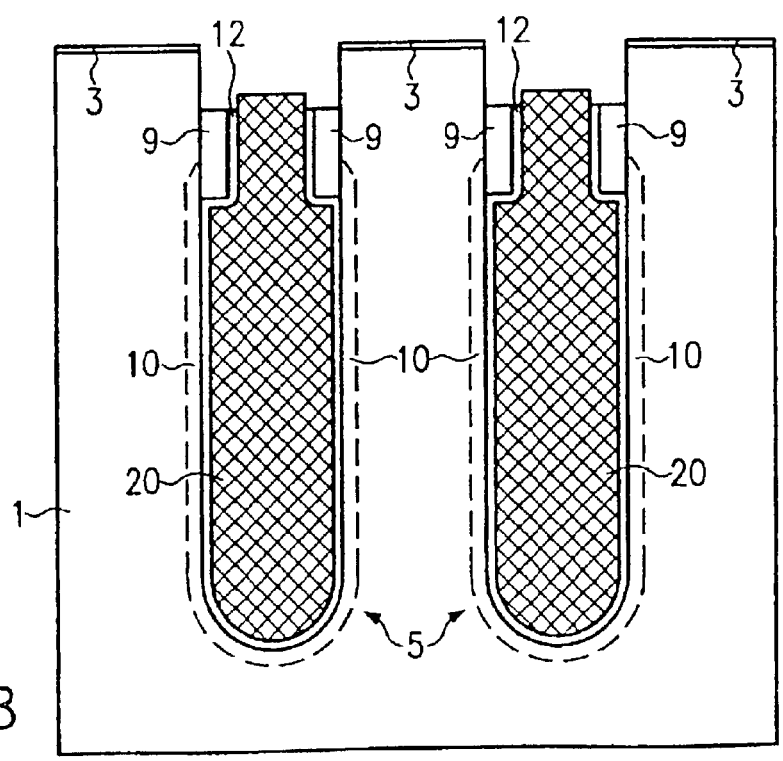

Finally, FIG. 8 also shows how the insulating collar 9 and the dielectric 12 are etched back selectively with respect to the metal carbide in the upper trench region. The subsequent completion of a memory cell by forming a select transistor in the silicon substrate 1 and making electrical contact between the transistor and the upper capacitor electrode 20 is known per se from the prior art, and consequently at this point reference will be made, by way of example, to U.S. Pat. No. 5,905,279 which is incorporated by reference herein.

A second embodiment of a method according to the invention for the fabrication of a trench capacitor will now be described with reference to FIGS. 9 to 14.

Figure 9:
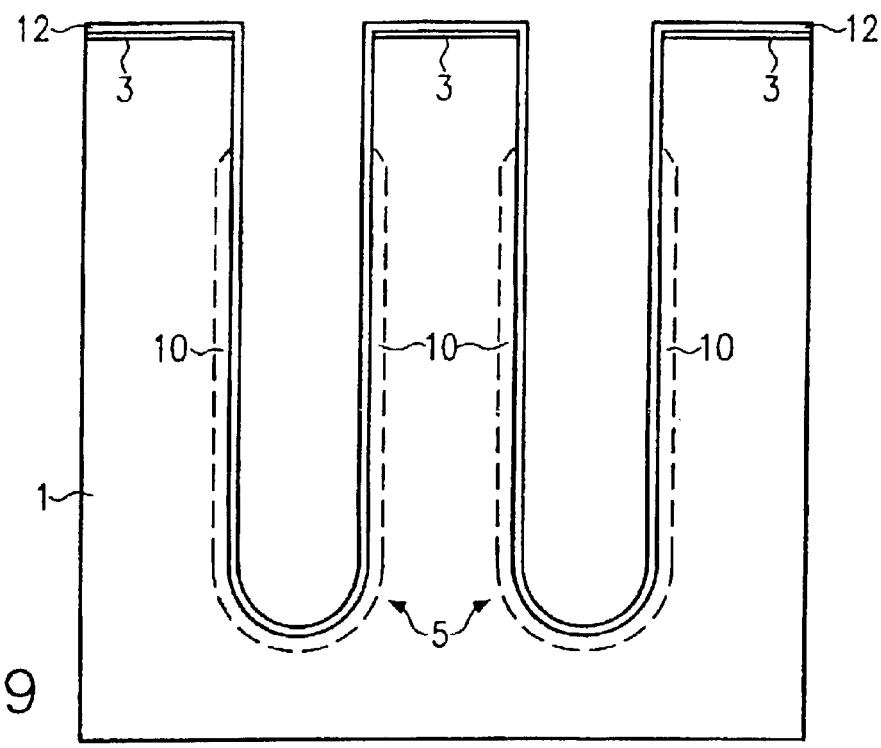
FIGS. 9–14 are diagrammatic, sectional views showing the individual method steps involved in the fabrication of the trench capacitor, with the insulating collar being formed after the dielectric has been formed and the trench has been filled.

The process sequence initially takes place as explained in FIG. 1 and the associated description. As has likewise been explained above in connection with FIG. 1, the trenches 5 are introduced into the silicon substrate 1. Then, the lower capacitor electrode 10 is formed, and after that the layer 4 is removed and the dielectric 12 is deposited. The result of these process steps is illustrated in FIG. 9.

Figure 10:
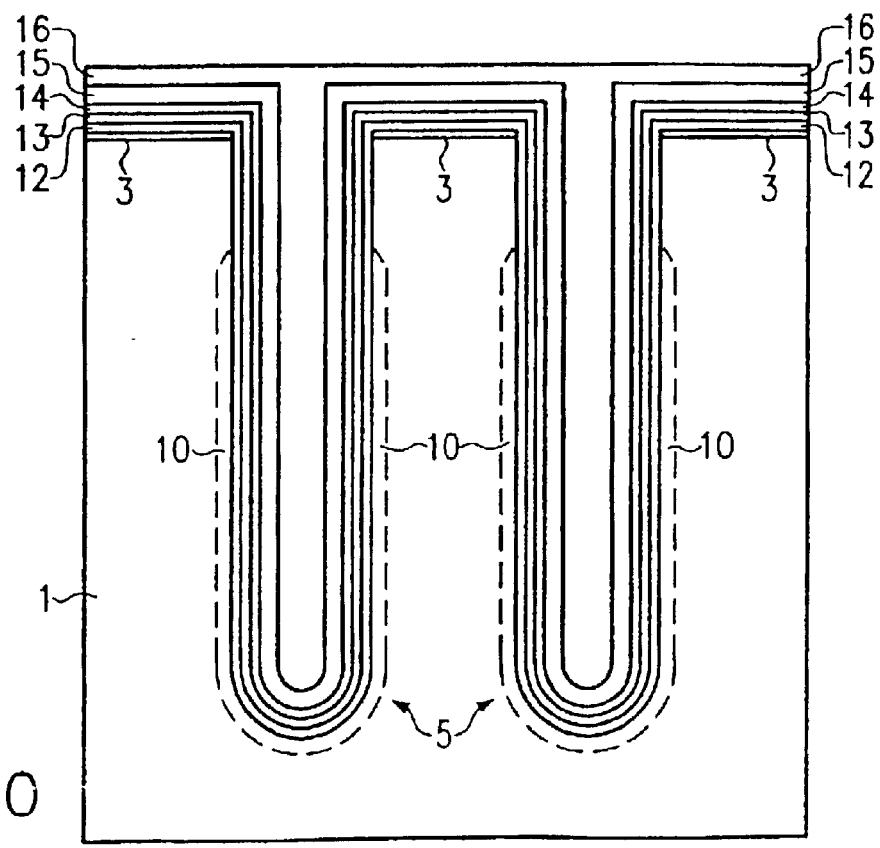

Then, as shown in FIG. 10, the metal and carbon layers 13 to 16 are deposited alternately, as in the first embodiment, until the trench 5 has been filled.

Figure 11:
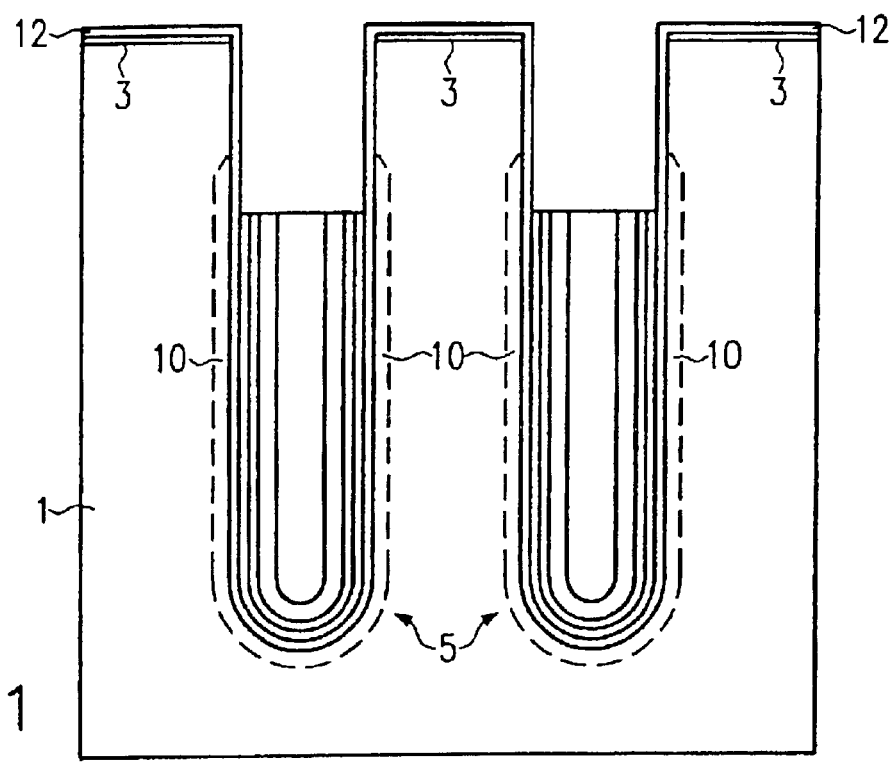

Next, as shown in FIG. 11, a dry etching step is carried out, in order for the surface of the layer sequence to be set back from the surface of the substrate 1.

Figure 12:
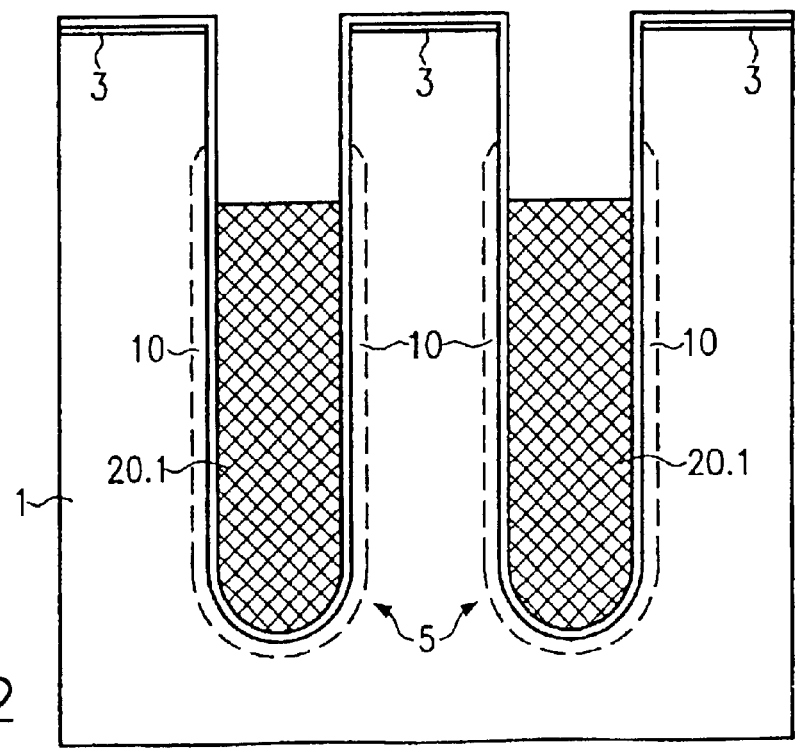

Then, as shown in FIG. 12, the carbide is formed in the manner that has been described above by a heat treatment step, so that a lower section 20.1 of the upper capacitor electrode 20 is formed. In this embodiment, the lower section 20.1 consists entirely of metal carbide.

Figure 13:
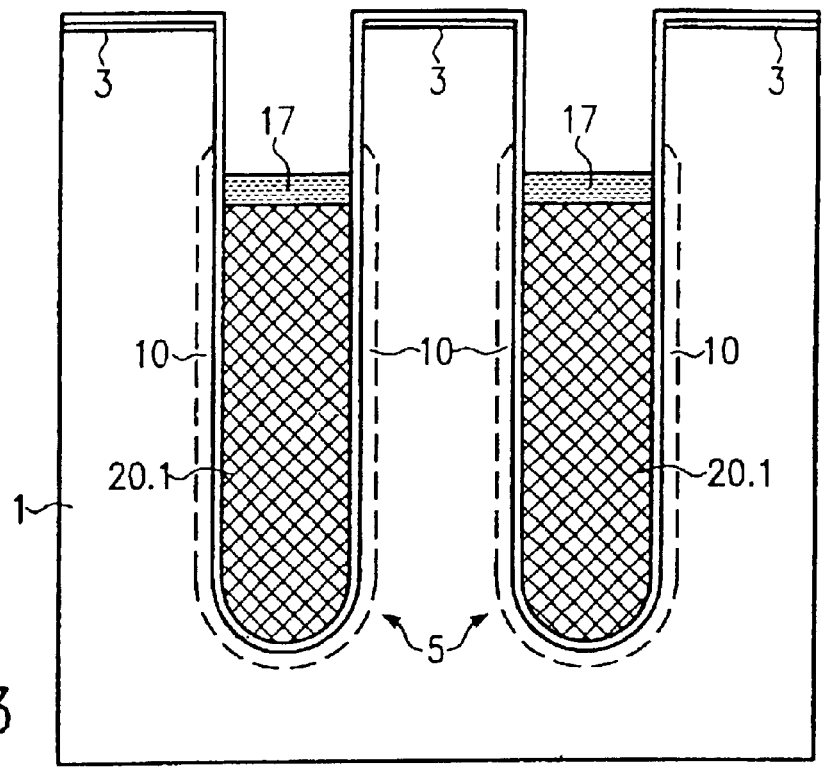

Next, as shown in FIG. 13, a protective layer 17, for example of polysilicon or $Si_3N_4$, is deposited on the lower section 20.1 of the upper capacitor electrode 20 in order to protect the metal carbide from oxidation during the subsequent formation of the insulating collar 9.

Figure 14:
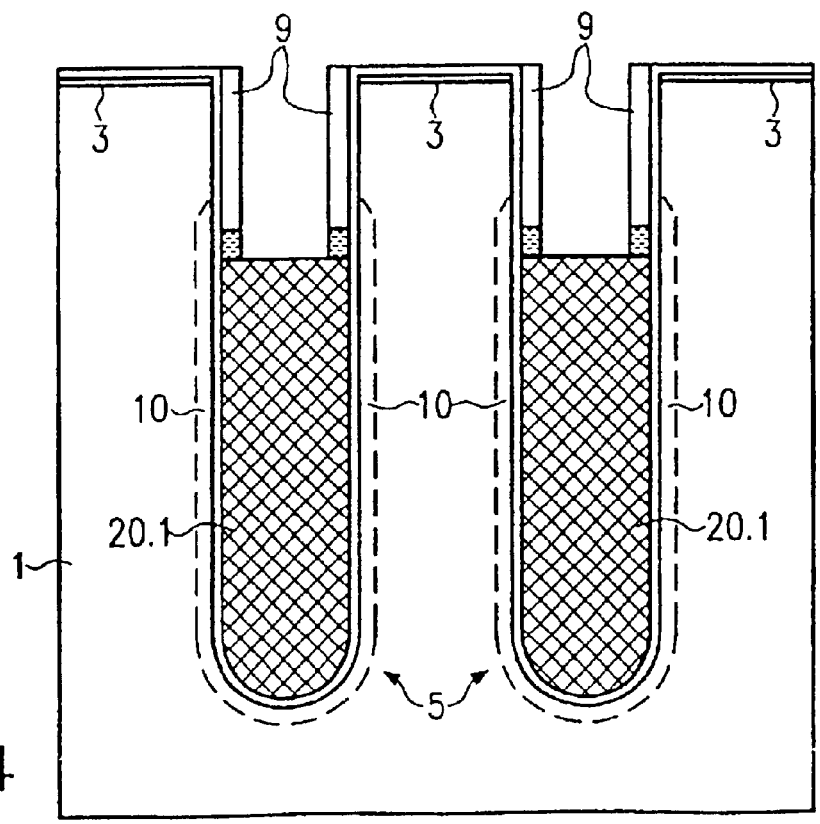

Then, as shown in FIG. 14, the insulating collar 9 is formed and the protective layer 17 is removed, with the exception of the region between insulating collar 9 and the lower trench filling of the upper capacitor electrode 20. During the subsequent completion of the component, the region inside the insulating collar 9 is filled with a further conductive material, in order to form an upper section of the upper capacitor electrode 20, during which process, if desired, the inventive method can again be used to fabricate a further metal carbide section of the upper capacitor electrode 20. However, it is also possible for the section within the insulating collar 9 to be filled with a different metal-containing material or with polycrystalline silicon.

Then, the insulating collar 9 is etched back selectively with respect to the upper trench filling, as has already been explained in connection with FIG. 8. The subsequent completion of a memory cell by forming a select transistor in the silicon substrate 1 and making electrical contact between the transistor and the upper capacitor electrode 20 is known per se from the prior art, in which context reference is made once again to U.S. Pat. No. 5,905,279.

As an alternative to the embodiment described above, it is also possible for the protective layer 17 to be applied first of all to the as yet untreated, etched-back layer sequence, then for the insulating collar 9 to be formed, the protective layer 17 to be partially removed and only then for the carbide formation to be carried out by the heat treatment step. When this sequence is used, it would also be possible for the section within the insulating collar to be filled in the manner described above with a further metal/carbon layer sequence before the formation of the carbide, and for the heat treatment only to be carried out after this has taken place.

In the two embodiments described, the metal/carbon layer sequence 13 to 16 is deposited directly on the storage dielectric 12. However, it is also possible for a layer of polycrystalline silicon, for example with a layer thickness of between 2 and 50 nm, to be deposited on the storage dielectric 12, and for the layer sequence only to be applied after this step. Then, during patterning or etching back, it is possible, for example in a first etching step, for the metal/carbon layer sequence to be etched back, and for the polycrystalline silicon layer only to be etched back subsequently, in a second etching step.

It is also not imperative for the layer sequence to fill the trench 5. Rather, the trench 5 may be partially filled with the layer sequence and may then be filled with other materials, such as polycrystalline silicon or another metal-containing material.

We claim:

1. A method for fabricating a metal carbide layer, which comprises the steps of:
   providing a substrate;
   depositing an alternating sequence of at least one metal layer and at least one carbon-containing layer on the substrate resulting in a layer sequence;
   patterning the layer sequence; and
   subsequently carrying out a heat treatment step resulting in the layer sequence being mixed and converted into a homogeneous metal carbide layer.

2. A method for fabricating a trench capacitor for use in a semiconductor memory cell, which comprises the steps of:
   providing a substrate;
   forming a trench in the substrate;
   forming a lower capacitor electrode adjoining a wall of the trench in a lower trench region;
   providing a storage dielectric, and in the trench the storage dielectric adjoins the lower capacitor electrode; and
   providing an upper capacitor electrode formed as a trench filling and adjoining the storage dielectric, at least a part of the upper capacitor electrode being formed by a metal carbide.

3. The method according to claim 2, which comprises forming the upper capacitor electrode to include a metal carbide layer formed by the steps of:
   depositing an alternating sequence of at least one metal-containing layer and at least one carbon-containing layer on the substrate resulting in a layer sequence; and
   subsequently carrying out a heat treatment step resulting in the layer sequence being mixed and converted into a homogeneous metal carbide layer.

4. The method according to claim 3, which comprises depositing the layers of the alternating sequence until the trench is filled.

5. The method according to claim 2, which comprises depositing a polycrystalline, doped silicon layer on the storage dielectric as part of the upper capacitor electrode.

6. The method according to claim 3, which comprises patterning the layer sequence before the layer sequence is converted into the metal carbide layer.

7. The method according to claim 6, which comprises during the patterning step, using an etching medium in which a ratio of etching rates of metal to carbon is in a range between 0.7 and 1.3.

8. The method according to claim 7, which comprises selecting the etching medium from the group consisting of $NF_3$, $SF_6$, and a mixture thereof.

9. The method according to claim 3, which comprises carrying out the heat treatment step in a non-oxidizing protective gas atmosphere with an addition of a hydrocarbon.

10. The method according to claim 9, which comprises using propane as the hydrocarbon.

11. The method according to claim 3, which comprises depositing the metal-containing layer and the carbon-containing layer in a quantitative ratio with respect to one another which corresponds to a stoichiometric composition of the metal carbide layer which is to be formed.

12. The method according to claim 3, which comprises patterning the layer sequence into a shape by etching, before it is converted into the metal carbide layer.

* * * * *